(12) United States Patent
Chen

(10) Patent No.: US 6,387,814 B1
(45) Date of Patent: May 14, 2002

(54) METHOD OF FABRICATING A STRINGERLESS FLASH MEMORY

(75) Inventor: Chien-Wei Chen, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/682,215

(22) Filed: Aug. 7, 2001

(51) Int. Cl.[7] .............................................. H01L 21/302
(52) U.S. Cl. ........................ 438/700; 438/709; 438/719; 438/723; 438/725; 438/743
(58) Field of Search ................................. 438/700, 709, 438/719, 725, 524, 532, 692, 723, 743

(56) References Cited

U.S. PATENT DOCUMENTS

| | | | | |
|---|---|---|---|---|
| 5,994,231 A | * | 11/1999 | Sonego et al. | 438/706 |
| 6,046,085 A | * | 4/2000 | Chan | 438/257 |
| 6,057,193 A | * | 5/2000 | Wang et al. | 438/266 |
| 6,172,395 B1 | * | 1/2001 | Chen et al. | 257/315 |
| 6,265,292 B1 | * | 7/2001 | Parat et al. | 438/524 |
| 6,319,789 B1 | * | 11/2001 | Carstensen | 438/396 |
| 6,326,266 B1 | * | 12/2001 | Brambilla et al. | 438/258 |

* cited by examiner

Primary Examiner—Robert Kunemund
Assistant Examiner—Binh X Tran
(74) Attorney, Agent, or Firm—Winston Hsu

(57) ABSTRACT

A semiconductor substrate is provided. A number of rows of layer stacks are formed on the semiconductor substrate with a shallow trench positioned between two adjacent layer stacks. Each layer stack is a polysilicon layer and a sacrificial layer and has two side walls. Each side wall of the layer stack intersects the bottom of the shallow trench at an angle of approximately 90 degrees. A HDPCVD silicon oxide layer is deposited to cover the layer stacks and the shallow trenches followed by a planarization process to remove portions of the HDPCVD silicon oxide layer to expose in the sacrificial layer. Then, the sacrificial layer is removed. An insulating layer, a word line layer, and a photoresist layer are formed on the polysilicon layer, respectively. The photoresist layer is patterned so as to define a position for forming a word line. A first dry etching process is performed to remove portions of the word line layer not covered by the photoresist layer with a first selectivity of polysilicon to silicon oxide. Following that, a second dry etching process is performed to etch portions of the insulating layer not covered by the photoresist layer with a second selectivity of polysilicon to silicon oxide. Finally, a third dry etching process is performed to etch the polysilicon layer with a third selectivity of polysilicon to silicon oxide, forming a T-shape side view for the remaining polysilicon layer.

12 Claims, 9 Drawing Sheets

METHOD OF FABRICATING A STRINGERLESS FLASH MEMORY

BACKGROUND OF INVENTION

1. Field of the Invention

The present invention relates to a method of fabricating a flash memory, and more particularly, to a method of fabricating a stringerless flash memory to prevent stringer leakage and improve data retention ability.

2. Description of the Prior Art

A flash memory is a non-volatile memory, which can preserve data within the memory even when an external power supply is lost. Recently, because flash memory is re-writable and re-erasable, it has been widely applied in the fabrication of electrical products, such as mobile phones, digital cameras, video players, personal digital assistants (PDA) or system on a chip (SOC).

Please refer to FIG. 1 of a cross-sectional diagram of a prior flash memory cell 30. As shown in FIG. 1, the flash memory cell 30 comprises a substrate 10, a floating gate 14, an ONO dielectric layer 18 and a word line 20. The floating gate 14, normally made from polysilicon, is positioned between an insulating layer 12a and 12b. Doping regions 11a and 11b, functioning as a bit line, are formed beneath the insulating layer 12a and 12b, respectively. The doping region 11a and 11b may also function as a buried drain or a buried source. In addition, a tunneling oxide layer 13 is positioned between the floating gate 14 and the substrate 10. Hot electrons tunnel through the tunneling oxide layer 13 to get in or get out of the floating gate 14, thus achieving data accessing.

During the fabricating process of the flash memory cell 30, however, a polysilicon residue 22 occurs causing current leakage problems. The side wall of both the insulating layers 12a, 12b is hard to keep perpendicular to the substrate 10 since the angle between the two planes is changing with an adjusting of the process parameters, thereby forming the polysilicon residue 22. Please refer to FIG. 1, while the insulating layer 12a and 12b intersect the substrate 10 at an angle θ greater than 90 degrees, the polysilicon residue 22 will form on the side wall of the insulating layer 12a and 12b as a result of an etching process to define patterns of both the word line 20 and the floating gate 14. The polysilicon residue 22 may also be called stringer. The polysilicon residue 22 on the side wall of the insulating layer 12a and 12b not only induces leakage currents but also affects the electrical performance of the flash memory cell, thus reducing data retention ability.

In order to prevent the occurrence of the stringer, precise control of the process parameters is required so as to form the angle θ as close to a right angle as possible. Specifically, the side wall of the floating gate 14 must be vertical so as to keep the side wall of the insulating layers 12a and 12b perpendicular to the surface of the substrate 10. In this case, however, the process window is too narrowed to ensure that a right angle θ is achieved with a control of the process parameters. Thus, problems of the stringer still occur.

SUMMARY OF INVENTION

It is therefore a primary objective of the present invention to provide a method of fabricating a flash memory to solve the above-mentioned problems.

It is another objective of the present invention to provide a method of fabricating a stringerless flash memory to achieve better reliability for the flash memory.

It is another objective of the present invention to provide a method of fabricating a stringerless flash memory to widen the process window.

It is still another objective of the present invention to provide a method of fabricating a flash memory with a T-shaped floating gate.

According to the claimed invention, a silicon oxide layer is formed on a semiconductor substrate. A plurality of rows of layer stacks are then formed on the silicon oxide layer with a shallow trench positioned between two adjacent layer stacks. Each layer stack includes a polysilicon layer and a sacrificial layer and has two side walls. In addition, each side wall of the layer stack intersects the bottom of the shallow trench at an angle of approximately 90 degrees. Following this, a high density plasma chemical vapor deposition (HDPCVD) silicon oxide layer is formed to cover the layer stacks and the shallow trenches. Then, the HDPCVD silicon oxide layer is planarized to expose the sacrificial layer. After the complete removal of the sacrificial layer, an insulating layer and a word line layer are formed, respectively, on the polysilicon layer followed by forming a photoresist layer on the word line layer to define a position for forming a word line. Subsequently, a first dry etching process is performed to remove portions of the word line layer not covered by the photoresist layer with a first selectivity of polysilicon to silicon oxide. Then, a second dry etching process is performed to etch portions of the insulating layer not covered by the photoresist layer with a second selectivity of polysilicon to silicon oxide. Finally, a third dry etching process is performed to etch the polysilicon layer with a third selectivity of polysilicon to silicon oxide.

It is an advantage of the present invention that a three-step etching process is used to form a T-shape side view for the polysilicon layer, preventing polysilicon from remaining on the side wall of the HDPCVD silicon oxide layer. Etching machines with a source power supply and a bias power supply, such as DPSPoly etcher of Applied Materials Co., are used in the third etching process. An etching gas, having a mixture of 90% to 95% HBr and 5% to 10% He—$O_2$ is also suggested for the third etching process. In addition, the source power supply ranges from 300 to 600 Watts, the bias power supply ranges from 70 to 150 Watts, and a pressure ranges from 50 to 100 Torrs. Under this environment, a better lateral etching ability is provided in the third etching process to effectively prevent occurrence of stringers.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 8 is a cross-sectional diagram along line BB" shown in FIG. 7.

DETAILED DESCRIPTION

Figure 6:
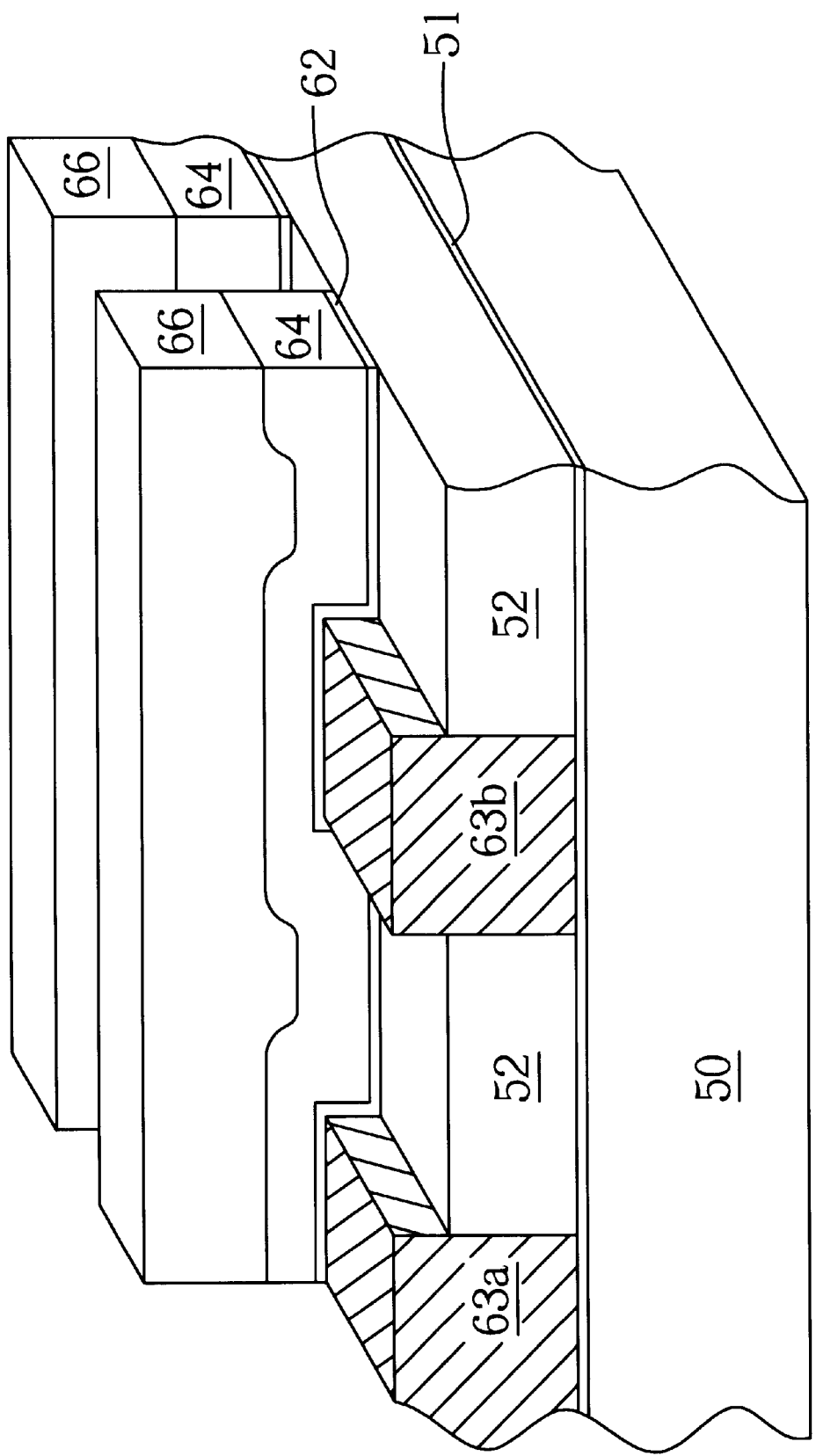
Figure 7:
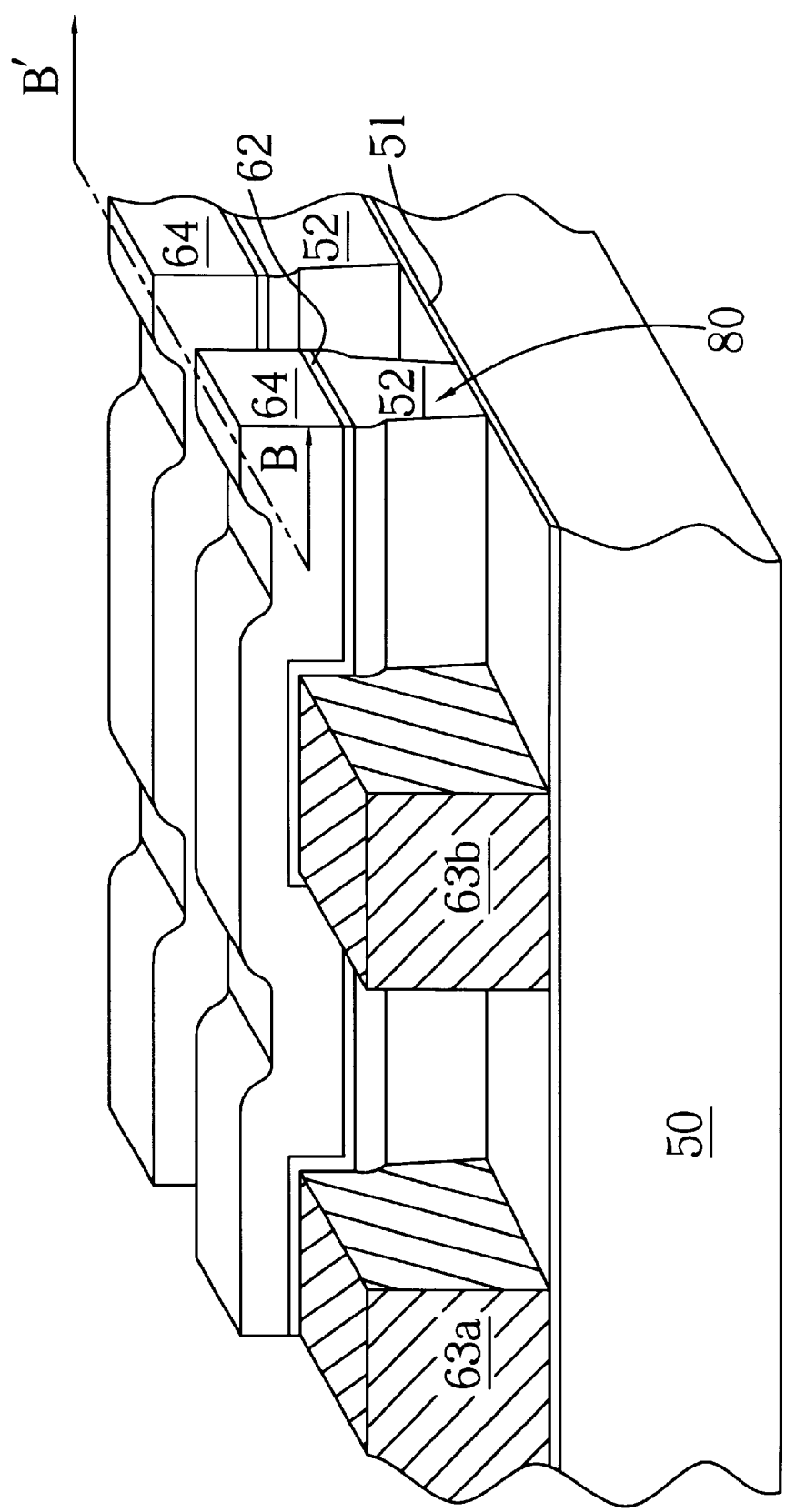
Figure 8:
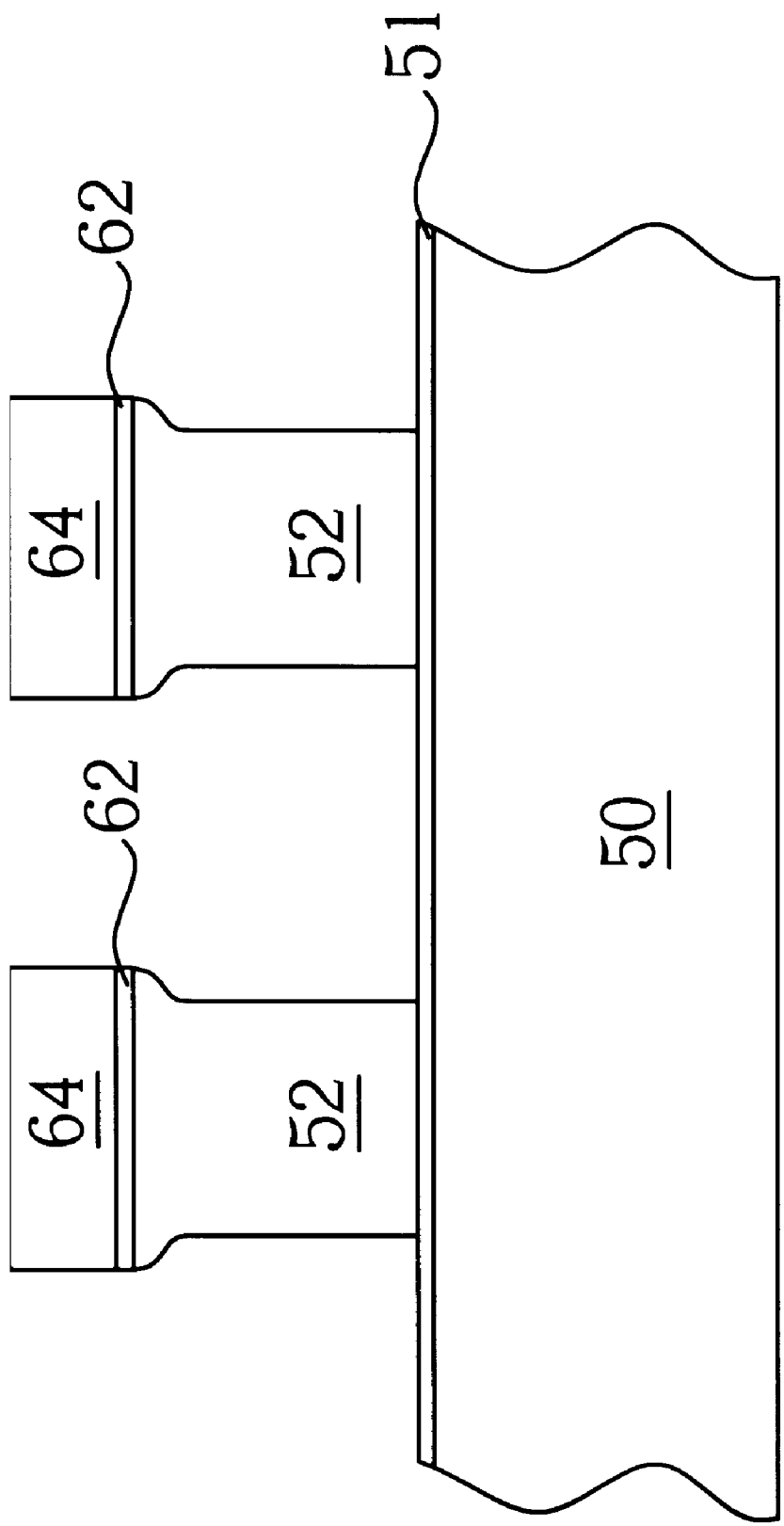

Please refer to FIG. 2 to FIG. 8. FIG. 2 to FIG. 8 are schematic diagrams of a best embodiment of the present invention to fabricate a flash memory cell on a silicon substrate 50. Wherein, FIG. 5A is a cross-sectional diagram along line AA" shown in FIG. 5B, and FIG. 8 is a cross-sectional diagram along line BB" shown in FIG. 7. Generally, the silicon substrate 50 comprises both a memory area and a periphery area. To emphasize the features of the present invention, only a relative portion within the memory area is magnified and shown in FIG. 2 to FIG. 7. The other portions of the silicon substrate 50, such as the periphery area, are not shown in FIG. 2 to FIG. 7.

Figure 1:
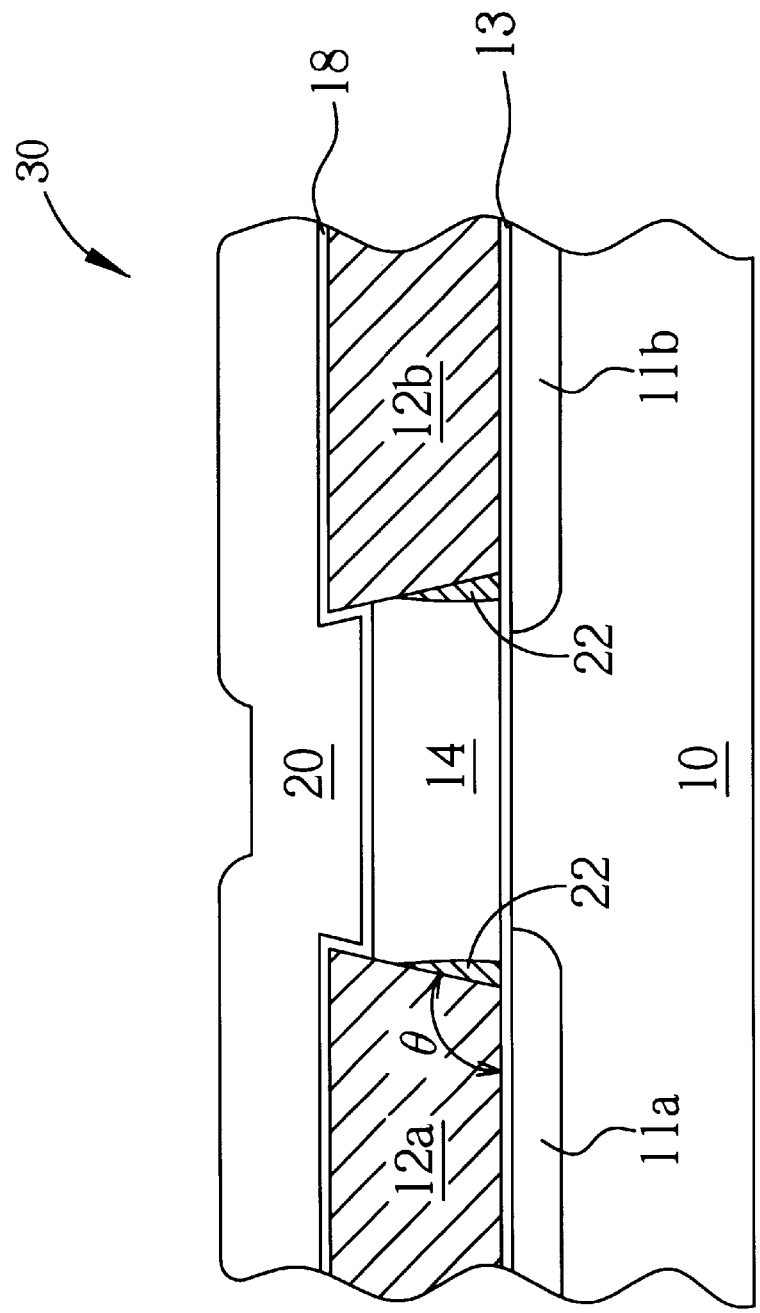
FIG. 1 is a cross-sectional diagram of a prior flash memory cell.
Figure 2:
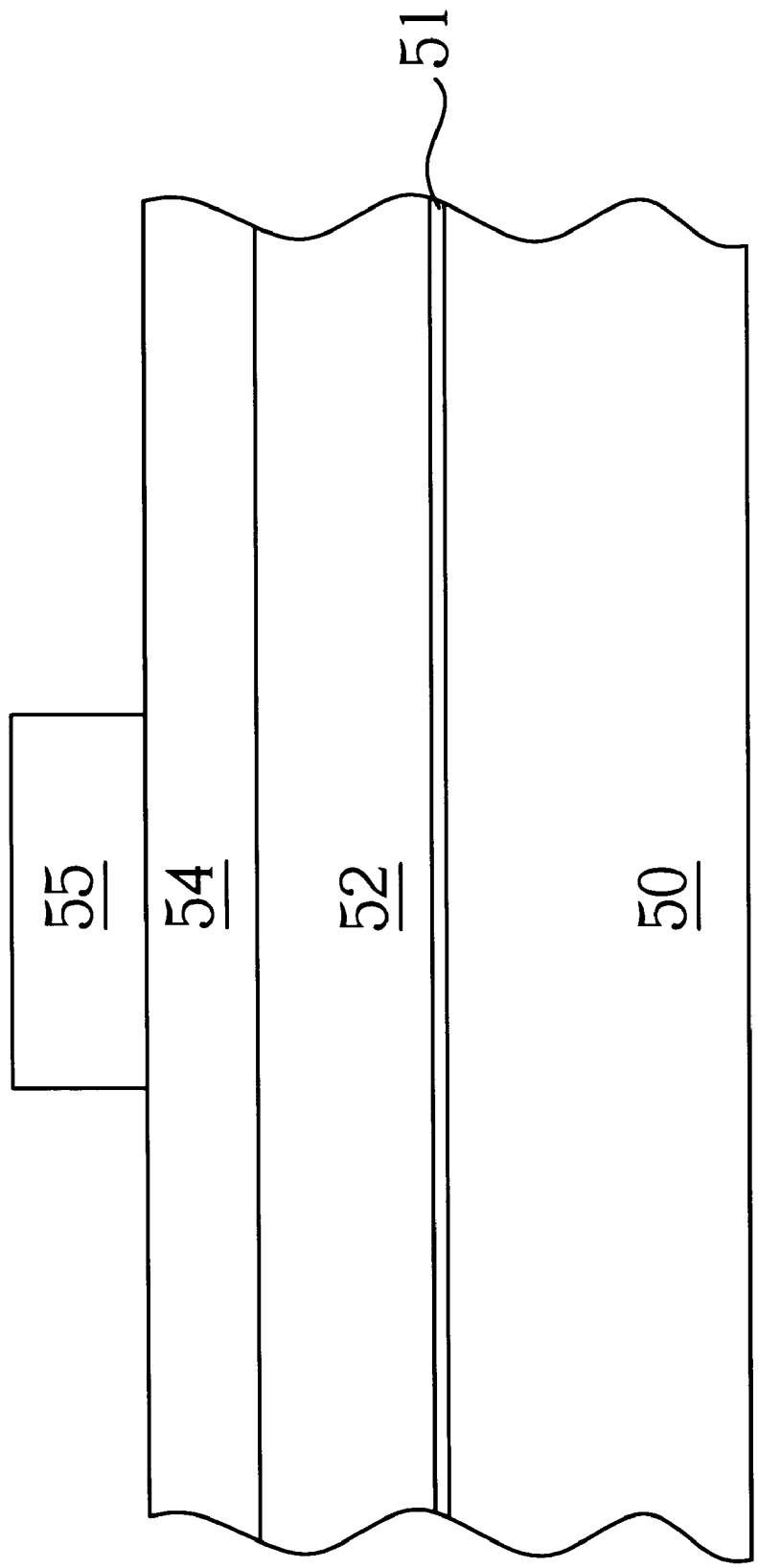
FIG. 2 to FIG. 8 are schematic diagrams of a method of fabricating a flash memory cell according to the present invention.

First, as shown in FIG. 2, an oxide layer 51 is formed on the surface of the silicon substrate 50. The oxide layer 51, functioning as a tunneling oxide layer adjacent to a floating gate, has a thickness of approximately 30 to 150 angstroms (Å). The oxide layer 51 is formed by a wet oxidation method or a dry oxidation method. The silicon substrate 50 is a lightly doped P-type single crystal silicon substrate with a <100> surface. Alternatively, the semiconductor substrate is a silicon-on-insulator (SOI) substrate formed by a well-known SIMOX method.

Next, an undoped polysilicon layer 52 with a thickness of 800 to 1000 Å is deposited on the surface of the oxide layer 51. A LPCVD is used to deposit the polysilicon layer 52 with silane ($SiH_4$) as reactive gas, at a temperature of 570 to 650° C., and a pressure of 0.3 to 0.6 Torrs. Following that, a silicon nitride layer 54 is deposited on the surface of the polysilicon layer 52. The silicon nitride layer 54, functioning as a sacrificial layer, is formed by a CVD. A thickness of the silicon nitride layer 54 ranges from 1000 to 1900 Å. A preferred thickness of the silicon nitride layer 54 is 1400 Å Subsequently, a lithographic process is performed, a patterned photoresist layer 55 is thus formed to define the position and channel length of the floating gate.

Figure 3:
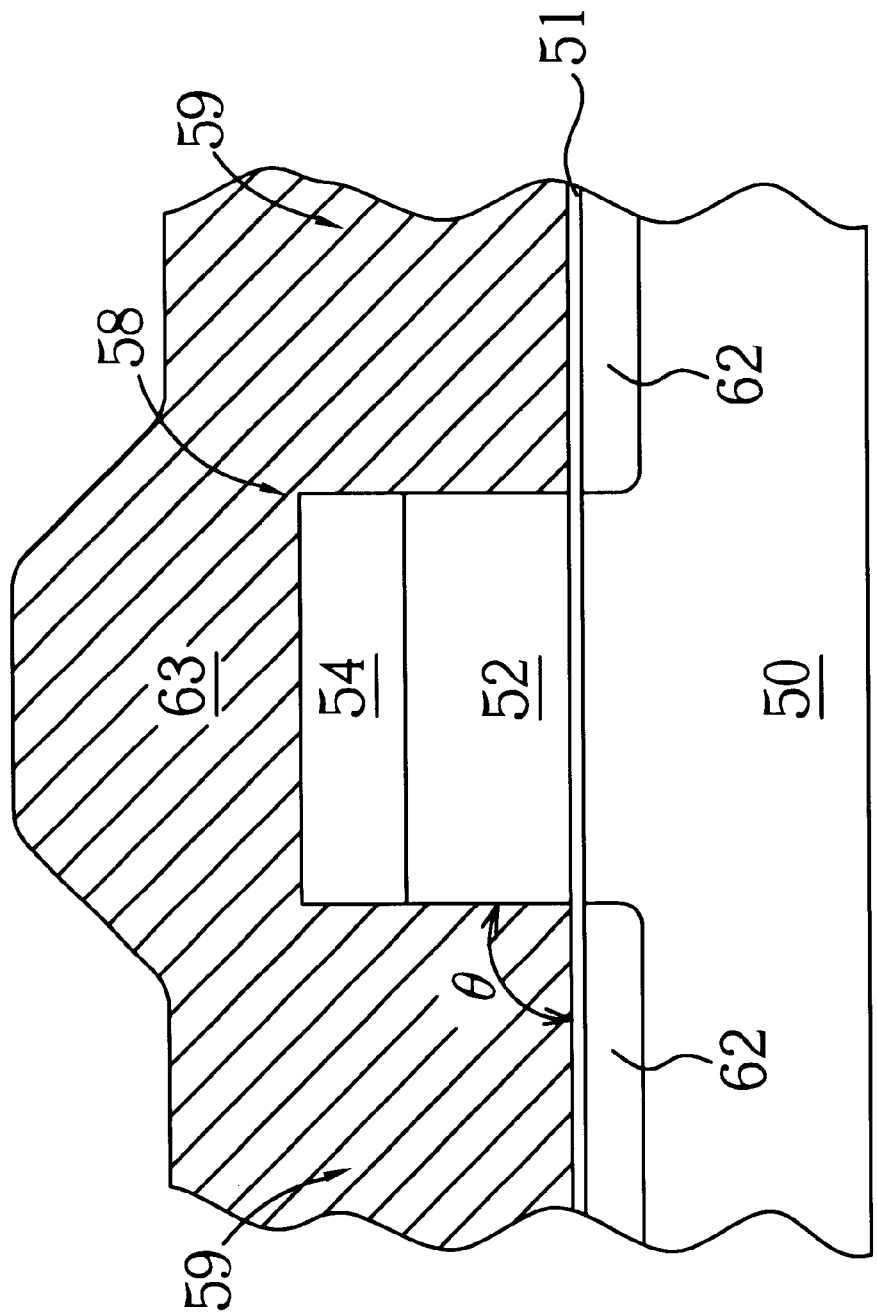

As shown in FIG. 3, a high-density plasma etching (HDP RIE) process is performed to etch portions of the silicon nitride layer 54 and the polysilicon layer 52 not covered by the photoresist layer 55. As a result, a plurality of rows of stacked structure 58 is formed on the silicon substrate 50 within the memory area. The stacked structure 58 is defined as a floating gate in a later process. During the HDP RIE process, a shallow trench 59, with a width of 0.25 to 0.4 micrometers, is also formed between two adjacent stacked structures 58. Therein, the bottom of the shallow trench 59 intersects each side wall of the stacked structure 58 at an angle θ. The angle θ is in a range from 88 to 92 degrees. While the angle θ ranges in 90 to 92 degrees, the stringer most easily forms in a later process. Subsequently, the photoresist layer 55 is removed.

Still referring to FIG. 3, an ion implantation process is thereafter performed to implant dopants with a predetermined concentration into the silicon substrate 50 so as to form a doping region 62. The doping region 62 functions as a bit line. The ion implantation process uses arsenic ions with an implantation energy of 50 to 150 KeV and an implantation dosage of 1E14 to 1E17 ions/cm$^2$, and is performed one or more times in a vertical direction at room temperature. Alternatively, other N-type ions, such as phosphorus ions, can be used in the ion implantation process. Following the ion implantation process, a high-density plasma chemical vapor deposition (HDPCVD) is performed to deposit a HDPCVD silicon oxide layer 63. The HDPCVD silicon oxide layer 63 covers the stacked structure 58 and fills the shallow trench 59.

Figure 4:
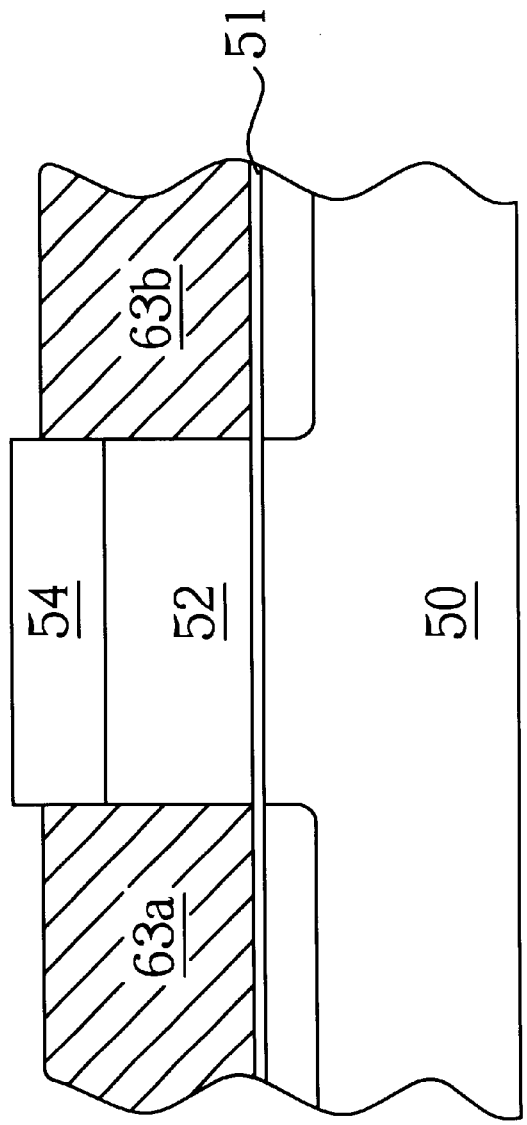

As shown in FIG. 4, using the silicon nitride layer 54 as a stop layer, a chemical mechanical polishing (CMP) process is performed to polish the HDPCVD silicon oxide layer 63 so as to expose the silicon nitride layer 54. After the CMP process, a HDP silicon oxide layer 63a and 63b are formed to enclose the stacked structure 58. Only a cross-sectional diagram is shown in FIG. 4 to FIG. 7, a dishing effect induced by the CMP process is thus not shown.

Figure 5A:
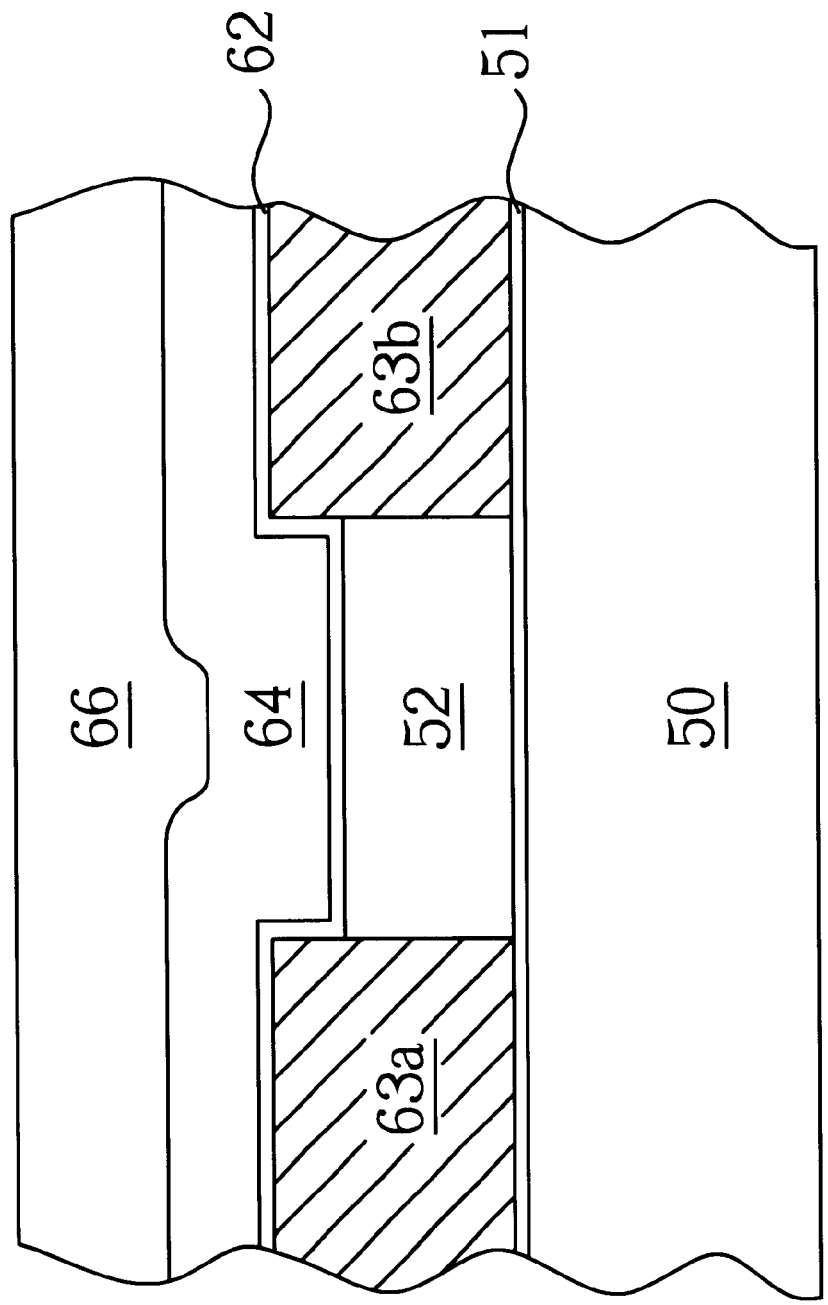
FIG. 5A is a cross-sectional diagram along line AA" shown in FIG. 5B.
Figure 5B:
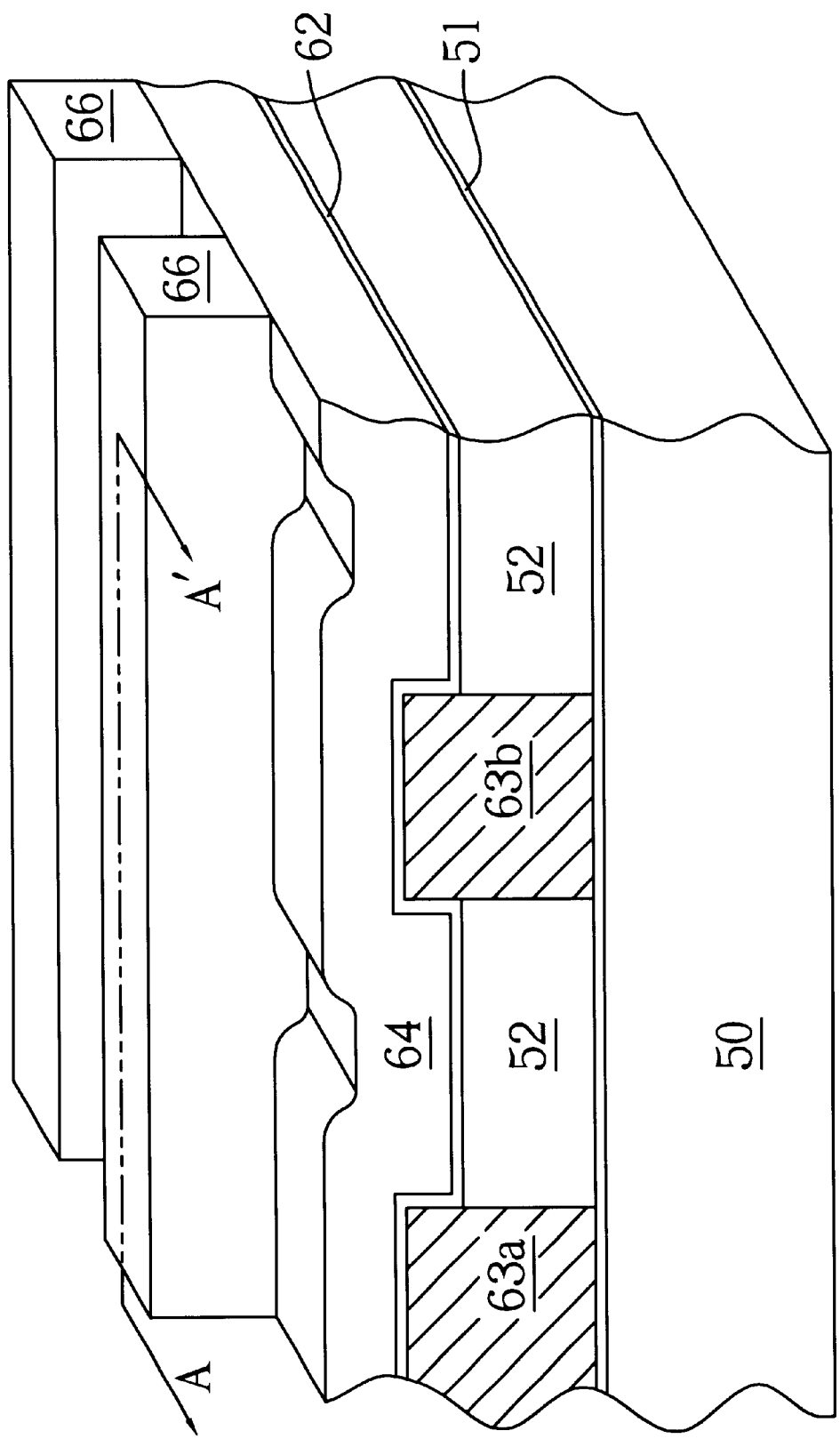

Then, as shown in FIG. 5A and FIG. 5B (FIG. 5A is a cross-sectional diagrams along line AA" shown in FIG. 5B), a wet etching process is performed using hot phosphoric acid ($H_3PO_4$) at 150° C. to 180° C. to completely remove the silicon nitride layer 54 as well as to expose the polysilicon layer 52. The wet etching process, performed in an etching tank (not shown), lasts an immersion time of seconds to minutes, depending on the thickness of the silicon nitride layer 54. Alternatively, other wet etching processes can be used to remove the silicon nitride layer 54.

Thereafter, an ONO dielectric layer 62 and a doped polysilicon layer 64 are formed, respectively, on the surface of the polysilicon layer 52. A photoresist layer 66 with patterns for forming a word line is then formed on the doped polysilicon layer 64. The doped polysilicon layer 64, functioning as a word line or a controlling gate of a flash memory cell, attains a required doping concentration by-using an in-situ doping CVD or an independent ion implantation process after the CVD.

The ONO dielectric layer 62 is formed by a normal ONO (oxidized-silicon nitride-silicon oxide) process. During the ONO process, an oxide layer with a thickness of 10 to 50 Å is first formed on the surface of the polysilicon layer 64. Thereafter, a silicon nitride layer (not shown) with a thickness of approximately 45 Å is formed on the oxide layer. The silicon nitride layer is formed by a plasma-enhanced CVD (PECVD) or LPCVD using dichlorosilane ($SiH_2Cl_2$) and ammonia ($NH_3$) as reactive gases. Finally, a silicon oxy-nitride layer with a thickness of 40 to 80 Å is formed on the silicon nitride layer. The silicon oxy-nitride layer is formed by performing a thermal healing process of thirty minutes under an oxygen-containing environment at a high temperature of 800° C. The silicon oxy-nitride layer functions to repair defects within the silicon nitride layer as well as to reduce leakage currents. Alternatively, the ONO dielectric layer 62 can be formed by other methods, such as furnace oxidation.

Selectively, in other embodiments of the present invention, a silicide layer, such as tungsten silicide ($WSi_2$), and an anti-reflection layer, such as silicon oxy-nitride (SiON), are formed on the doped polysilicon layer 64. The silicide layer functions to reduce the resistance of the word line, while the anti-reflection layer functions to provide more precise patterns for forming the word line.

Subsequently, as shown in FIG. 6, using the photoresist layer 66 as an etching mask, a first etching process is performed to remove portions of the doped polysilicon layer 64 down to the surface of the ONO dielectric layer 62. The first etching process uses reactive ion etching or plasma etching. The first etching process has a selectivity of the polysilicon layer 52 to the HDPCVD silicon oxide layer 63a/63b ranging from 5 to 10. The selectivity refers to a ratio of an etching rate on the polysilicon layer 52 to an etching rate on the HDP silicon oxide layer 64. Etching machines with a source power supply and a bias power supply, such as Decoupled Plasma Source (DPS) Poly etcher of Applied Materials Co., are suggested. An etching gas, such as a mixture of HBr, $Cl_2$, and He—$O_2$ is suggested. The source power supply ranges from 600 to 800 Watts. The bias power supply ranges from 70 to 150 Watts. A pressure of 5 to 10 Torrs is suggested.

Following this, a second etching process is performed with a selectivity of the polysilicon layer 52 to the HDPCVD silicon oxide layer 63a/63b ranging from 0.7 to 0.9. Etching machines with a source power supply and a bias power supply, such as DPSPoly etcher of Applied Materials Co., are used in the second etching process. An etching gas, having a mixture of $CF_4$ and Ar gases, and a ratio of the flowing rates of the gases to be 0.13, is also suggested for the second etching process. In addition, the source power supply ranges from 600 to 800 Watts, the bias power supply ranges from 60 to 100 Watts, and a pressure ranges from 5 to 10 Torrs.

Following this, as shown in FIG. 7, a third etching process is performed. The selectivity of the polysilicon layer 52 to the HDPCVD silicon oxide layer 63a/63b is adjusted to be greater than 15. Etching machines with a source power supply and a bias power supply, such as DPSPoly etcher of Applied Materials Co., are suggested. An etching gas, having a mixture of 90% to 95% HBr and 5% to 10% He—O is suggested. The source power supply ranges from 300 to 600 Watts. The bias power supply ranges from 70 to 150 Watts. A pressure of 50 to 100 Torrs is suggested. Under this environment, the selectivity of the polysilicon layer 52 to the HDPCVD silicon oxide layer 63a/63b may increase to a range of 15 to 20. Following the third etching process, the photoresist layer 66 is removed. As shown in FIG. 8, FIG. 8 is a cross-sectional diagram along line BB" shown in FIG. 7. After the third etching process, since the etching parameters are changed, a T-shaped polysilicon layer 52 is thus formed. In addition, because of a better lateral etching ability is attained in the third etching process to form the T-shape polysilicon layer 52, a stringer (polysilicon residue) is prevented from forming on the side wall of the HDPCVD silicon oxide layer 63a and 63b.

In contrast to the prior art of fabricating the flash memory cell, the method of the present uses a three-step etching process to replace the etching process of the prior art. The three-step etching process includes the first etching process, the second etching process and the third etching process mentioned above. Using the third etching process to form the T-shape structure, occurring of bottom corner stringers is thus prevented throughout the etching process of the polysilicon layer 52. As a result, the fabricating process of the present invention effectively prevents leakage currents resulting from the bottom corner stringers. Both the reliability and data retention ability of the flash memory cell are thus improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a stringerless flash memory, the method comprising:

forming a silicon oxide layer on a surface of a semiconductor substrate;

forming a plurality of rows of layer stacks on the silicon oxide layer, a shallow trench being formed between two adjacent layer stacks, each layer stack comprising a polysilicon layer and a sacrificial layer, each side wall of the layer stack intersecting the bottom of the shallow trench at an angle of approximately between 88 and 92 degrees;

depositing a high density plasma chemical vapor deposition (HDPCVD) silicon oxide layer to cover the layer stacks and the shallow trenches;

planarizing the HDPCVD silicon oxide layer to expose the sacrificial layer;

removing the sacrificial layer;

forming an insulating layer and a word line layer on the polysilicon layer, respectively;

forming a photoresist layer on the word line layer, the photoresist layer defining a position for forming a word line;

performing a first etching process to remove portions of the word line layer not covered by the photoresist layer, the first etching process having a first selectivity of polysilicon to silicon oxide;

performing a second etching process to remove portions of the insulating layer not covered by the photoresist layer, the second etching process having a second selectivity of polysilicon to silicon oxide; and performing a third etching process to etch the polysilicon layer, the third etching process having a third selectivity of polysilicon to silicon oxide.

2. The method of claim 1 wherein the sacrificial layer comprises silicon nitride.

3. The method of claim 1 wherein the polysilicon layer of the layer stack comprises undoped polysilicon.

4. The method of claim 1 wherein the insulating layer is an ONO dielectric layer.

5. The method of claim 1 wherein the word line layer comprises a polysilicon layer, a silicide layer and an anti-reflection layer.

6. The method of claim 1 wherein the first selectivity of polysilicon to silicon oxide ranges from 5 to 10.

7. The method of claim 1 wherein the second selectivity of polysilicon to silicon oxide ranges from 0.7 to 0.9.

8. The method of claim 1 wherein the third selectivity of polysilicon to silicon oxide is greater than 15.

9. The method of claim 1 wherein after the third etching process, the polysilicon layer has a T-shaped side view.

10. The method of claim 1 wherein the first etching process, the second etching process, and the third etching process are all dry etching processes.

11. The method of claim 1 wherein the method further comprises an ion implantation process to form a buried bit line within the semiconductor substrate beneath the shallow trench.

12. The method of claim 11 wherein the ion implantation process is performed after the shallow trench is formed.

* * * * *